(12) United States Patent
Bang et al.

(10) Patent No.: US 10,784,874 B1
(45) Date of Patent: Sep. 22, 2020

(54) ALL-DIGITAL VOLTAGE MONITOR (ADVM) WITH SINGLE-CYCLE LATENCY

(71) Applicant: Intel Corporation, Santa Clara, CA (US)

(72) Inventors: Suyoung Bang, Hillsboro, OR (US); Eric Samson, Folsom, CA (US); Wootaek Lim, Ann Arbor, MI (US); Charles Augustine, Portland, OR (US); Muhammad Khellah, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/783,096

(22) Filed: Feb. 5, 2020

(51) Int. Cl.
| | |
|---|---|
| *H03L 7/02* | (2006.01) |
| *H03M 1/30* | (2006.01) |
| *H03M 1/38* | (2006.01) |
| *G04F 10/00* | (2006.01) |
| *H03L 7/081* | (2006.01) |
| *H03L 7/085* | (2006.01) |

(52) U.S. Cl.
CPC .......... *H03L 7/0814* (2013.01); *G04F 10/005* (2013.01); *H03L 7/085* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,844,908 A | * | 12/1998 | McCallan | G06F 1/10 370/518 |
| 8,447,548 B2 | * | 5/2013 | McKay | G01R 31/002 702/66 |
| 9,746,832 B1 | * | 8/2017 | Yao | G04F 10/005 |
| 2004/0114698 A1 | * | 6/2004 | Barrett | H04L 7/0338 375/355 |

OTHER PUBLICATIONS

Drake, Alan et al., "A Distributed Critical-Path Timing Monitor for a 65nm High-Performance Microprocessor", ISSCC 2007, Session 22, Digital Circuit Innovations 22.1, 2 pgs.

Gnad, Dennis R. et al., "Voltage Drop-based Fault Attacks on FPGAs using Valid Bitstreams", Institute of Computer Engineering, Karlsruhe Institute of Technology, received from client Nov. 2019, 7 pgs.

Kurd, Nasser et al., "Next Generation Intel Micro-architecture (Nehalem) Clocking Architecture", 2008 Symposium on VLSI Circuits Digest of Technical Papers, 2 pgs.

(Continued)

*Primary Examiner* — An T Luu
(74) *Attorney, Agent, or Firm* — Green, Howard & Mughal LLP

(57) ABSTRACT

An all-digital voltage monitor (ADVM) generates a multi-bit output code that changes in proportion to a voltage being monitored, by leveraging the voltage impact on a gate delay. ADVM utilizes a simple delay chain, which receives a clock-cycle-long pulse every clock cycle, such that the monitored supply voltage is sampled for one full cycle every cycle. The outputs of all delay cells of the delay chain collectively represents a current voltage state as a digital (Continued)

thermometer code. In AVDM, a voltage droop event thus results in a decrease in the output code from a nominal value, while an overshoot results in an increase in the output code.

20 Claims, 9 Drawing Sheets

(56) References Cited

OTHER PUBLICATIONS

Muhtaroglu, Ali et al., "On-Die Droop Detector for Analog Sensing of Power Supply Noise", IEEE Journal of Solid-State Circuits, vol. 39, No. 4, Apr. 2004, 10 pgs.
Shibahara, Shinichi et al., "A 16 nm FinFET Heterogeneous Nona-Core SoC Supporting ISO26262 ASIL B Standard", IEEE Journal of Solid-State Circuits, vol. 52, No. 1, Jan. 2017, 12 pgs.

* cited by examiner

ALL-DIGITAL VOLTAGE MONITOR (ADVM) WITH SINGLE-CYCLE LATENCY

BACKGROUND

An analog voltage droop detector, albeit fast, requires careful re-design when porting from one process to another. For example, analog droop detector do not scale with process technology. Analog droop detectors also typically need a clean power supply for their reference voltage generation making them design and area costly, especially for distributed voltage motioning.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
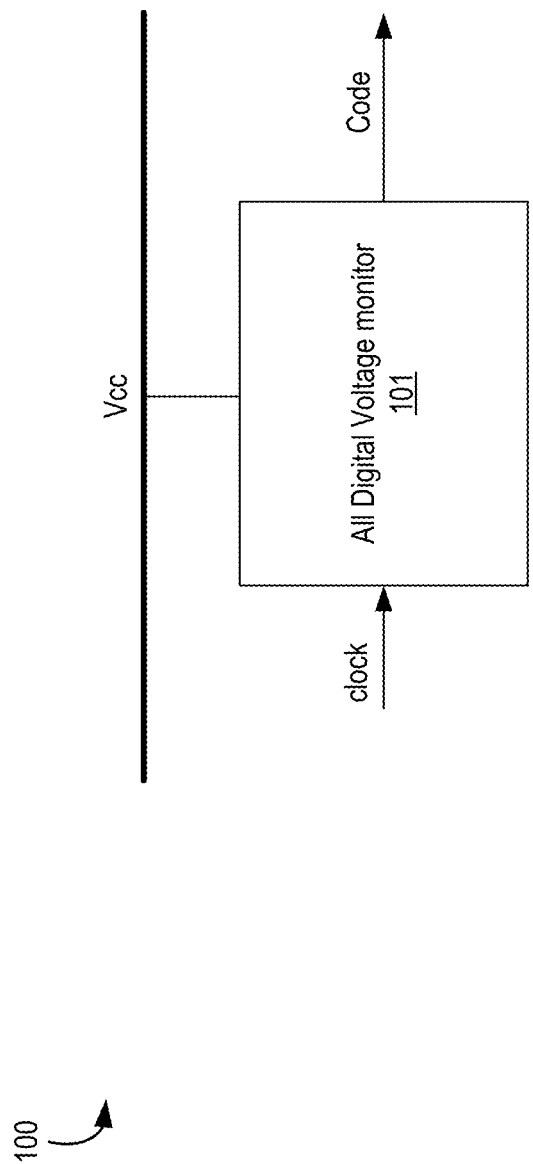
FIG. 1 illustrates a high-level usage architecture of an all-digital voltage monitor (ADVM) that generates a digital code using a clock, in accordance with some embodiments.

On-die voltage monitors provide a means to observe the behavior of a voltage rail (e.g., power supply rail Vcc) of a given computing intellectual property (IP) block while executing diverse workloads. An all-digital voltage monitor (ADVM) is easily instantiated as many times as needed inside the IP block providing insights into local hot spots. Here, the term "Intellectual Property Block" or "IP Block" generally refers to a reusable unit of logic, cell, or integrated circuit layout design that is the intellectual property of one party. IP blocks such as a IP processing cores may be licensed to another party or can be owned and used by a single party alone. An ADVM is both IP and process agnostic enabling rapid development of a critical post-silicon debug feature independent of a given technology and IP architecture. An ADVM quickly and accurately detects a local fast supply voltage droop. A supply voltage droop degrades maximum IP frequency, or necessitates higher voltage guard band with associated power cost. A fast local droop detection combined with some local droop mitigation (e.g., local instruction throttling or local charge injection) reduces the impact of the droop on maximum frequency (Fmax) or minimum operating voltage (Vmin).

The ADVM of various embodiments, has multi-bit resolution and single cycle latency. The ADVM of some embodiments generates a multi-bit output code that changes in proportion to a monitored voltage, by leveraging the voltage impact on a gate delay. In some embodiment, the ADVM utilizes a simple delay chain, which receives a clock-cycle-long pulse every clock cycle, such that the monitored supply voltage is sampled for one full cycle every cycle. The outputs of all delay cells of the delay chain collectively represents a current voltage state as a digital thermometer code. In the AVDM, a voltage droop event thus results in a decrease in the output code from a nominal value, while an overshoot results in an increase in the output code. To address any possible aliasing noise for distributed droop detection, various embodiment apply bubble insertion for fast droop mitigation.

There are many technical effects of various embodiments. For example, the ADVM is a simple APR-friendly design that may not need any tunable gate delay element (e.g. logic, interconnect, memory, etc.), making it IP agnostic, while enabling rapid development independent of the given process technology. Here, the term APR generally refers to an automatic placement and routing scheme. Tools for APR are used to layout digital integrated circuits, which include digital standard library cells such as buffer, inverter, AND gate, NAND gate, OR gate, NOR gate, multiplexer, flip-flop (FF), etc. Digital standard-cell libraries provide pre-designed layouts of digital standard cells for APR. Most of digital integrated circuits including microprocessors and graphics cores are built with industry-standard APR tools such as Synopsys® IC Compiler, and Cadence® Encounter. It uses digital circuits that generate digital signals as opposed to analog circuits that generate analog signals. As such, the ADVM generates an accurate representation of sampled voltage in multi-bit output code that can monitor a wide range of voltage changes (e.g., greater than 400 mV), at a fast response time of only one clock cycle latency. With comprehensive high-volume manufacturing (HVM) characterization flow, the ADVM monitors supply voltage accurately (e.g., with less than 7 mV error) across a very wide range of process-voltage-temperature (PVT) and IP clock frequency conditions. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

Here, the term "analog signal" is any continuous signal for which the time varying feature (variable) of the signal is a representation of some other time varying quantity, i.e., analogous to another time varying signal.

Here, the term "digital signal" is a physical signal that is a representation of a sequence of discrete values (a quantified discrete-time signal), for example of an arbitrary bit stream, or of a digitized (sampled and analog-to-digital converted) analog signal.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a high-level usage architecture 100 of an all-digital voltage monitor (ADVM) that generates a digital code using a clock, in accordance with some embodiments. Architecture 100 comprises an ADVM 101, which is IP agnostic. ADVM 101 couples to a power supply rail Vcc to monitor any anomalies in the power supply voltage. Such anomalies include droop on Vcc, which is caused by power delivery network (PDN) resonance associated of effective resistance, parasitic inductance, and de-coupling capacitance of power delivery network because of a sudden load current increase due to activity change of logic or an IP powered by Vcc. Anomalies also include overshoot on Vcc, which is caused by PDN resonance associated of effective resistance, parasitic inductance, and de-coupling capacitance of PDN because of a sudden load current decrease due to activity change logic or an IP powered by Vcc. Anomalies also include slow change on Vcc due to IR drop, where 'I' indicates load current of logic or an IP, and 'R' indicates effective resistance of the PDN. In some embodiments, ADVM 101 utilizes Vcc impact on gate delay (e.g., propagation delay through an inverter, buffer, or a similar logic gate) to monitor Vcc level. Gate delay increases with lower Vcc level.

ADVM 101 comprises digital components such as buffers, inverters, flip-flops, multiplexers, AND/NAND gates to provide an accurate representation of sampled voltage in multi-bit output code that can monitor a wide range of voltage changes (e.g., greater than 400 mV), at a fast response time of only one clock cycle latency. ADVM 101 uses a clock (e.g., an IP domain clock also referred to as domain clock) as input to generate a clock-cycle-long pulse that passes through an inverter delay chain, every cycle. Here, domain generally refers to a logic area such as a core, functional unit block (e.g., execution unit, arithmetic logic unit, floating-point unit, etc.) that operates using a particular clock and power supply. Domain clock is the clock to such logic area. In some embodiments, flip-flops sample inverters' states at every rising edge of the domain clock. For an odd cycle, high-phase of the divided clock passes through the delay chain, and for an even cycle, low-phase of the divided clock passes through the delay chain. Therefore, to generate consistent output codes every domain clock cycle, regardless of the clock phase passed to the chain, ADVM 101 uses polarity inversion of the code every other cycle. In some embodiments, simple multiplexors controlled by the divided clock implement polarity inversion of the code every other cycle.

In some embodiments, to suppress any flip-flop metastability-induced bubble in the code, ADVM 101 utilizes bubble suppression logic gates. The output Code of ADVM 101 is a digital code such as a thermometer code. However, the embodiments are not limited to a thermometer code. Other codes such as binary code and Gray encoded codes can be used.

Figure 2:
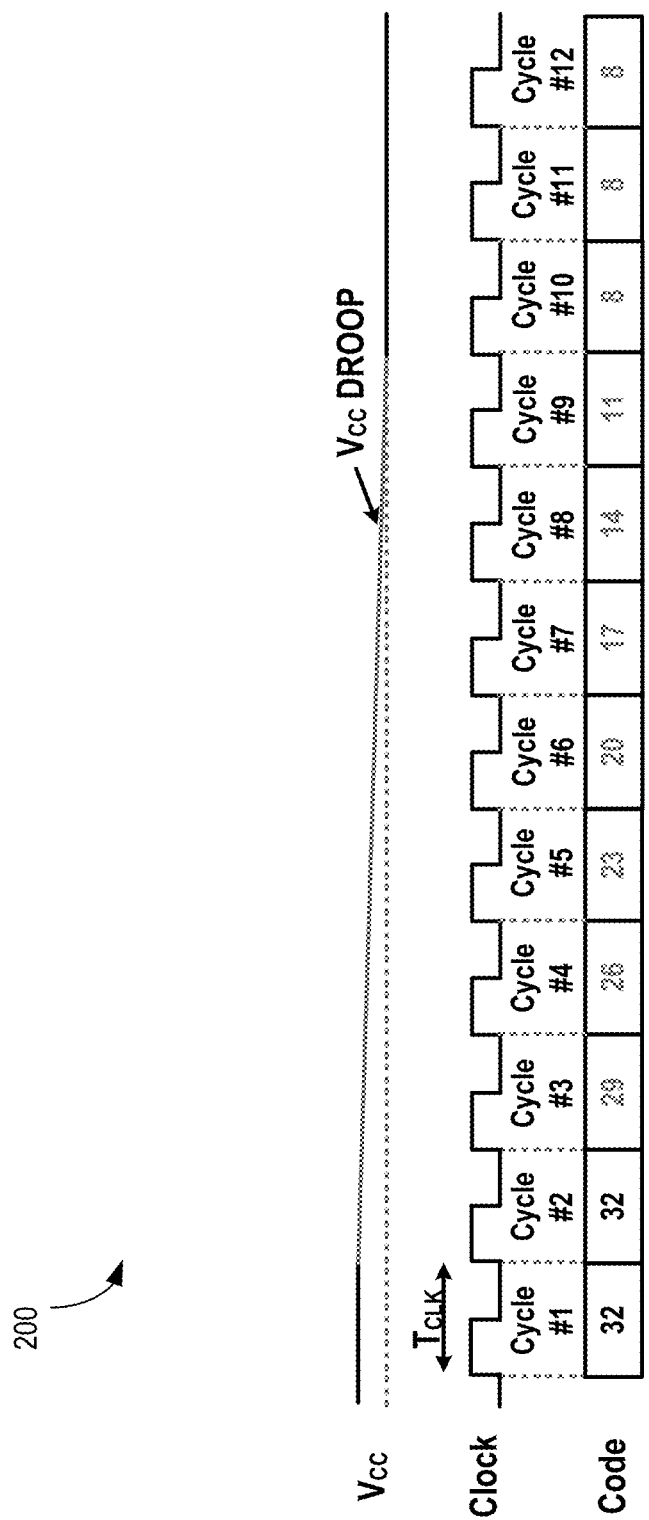
FIG. 2 illustrates a plot showing operation of the ADVM as it monitors voltage change in power supply node Vcc, in accordance with some embodiments.

FIG. 2 illustrates plot 200 showing operation of ADVM as it monitors voltage change in power supply node Vcc, in accordance with some embodiments. ADVM 101 generates multi-bit output Code that changes in proportion to Vcc. For instance, when Vcc continues to droop, ADVM output code decreases every cycle.

Figure 3:
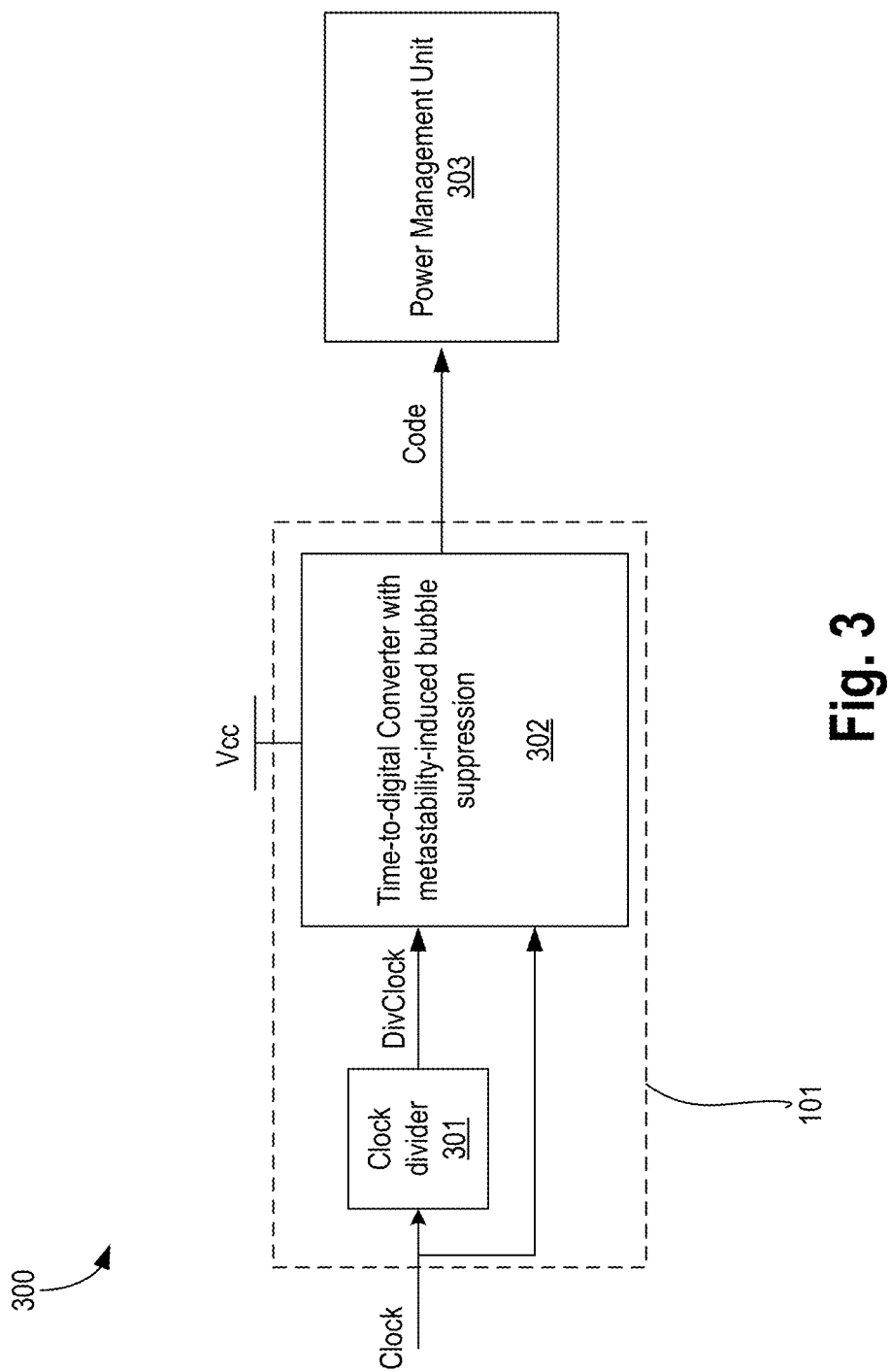
FIG. 3 illustrates a high-level architecture of the ADVM, in accordance with some embodiments.

FIG. 3 illustrates a high-level architecture 300 of ADVM 101, in accordance with some embodiments. Architecture 300 of FIG. 3 illustrates ADVM 101, which includes a clock divider 301 and a time-to-digital converter (TDC) 302. In various embodiments, clock divider 301 receives the input clock and generates a frequency-divided clock DivClock for TDC 302. Any suitable clock source can generate the input clock. For example, a phase locked loop (PLL), delay locked loop (DLL), frequency locked loop (FLL), ring oscillator, etc., can be used to generate the input clock. TDC 302 is a time digitizer that measures a time interval and converts it into digital (e.g., binary) output Code. In some embodiments, clock divider 301 is a divide-by-two frequency divider. In other embodiments, other divider ratios (e.g., divide-by-4, divide-by-8, etc.) can be used.

In various embodiments, TDC 302 has a latency of one cycle of the input clock. In some embodiments, TDC 302 comprises a delay chain that include delay cells. The delay chain receives the frequency-divided clock DivClk at an input of the delay chain. The delay chain couples to a plurality of sequential circuitries. Each of the sequential circuitries couples to an output of an individual delay cell of the delay chain. A selection circuitry couples with the plurality of sequential circuitries. The selection circuitry includes multiple multiplexers. Each multiplexer couples to an individual sequential circuitry of the plurality of sequential circuitries. In various embodiments, TDC 302 applies polarity inversion of the code every other cycle. Multiple multiplexors controlled by the divided clock DivClk implement polarity inversion of the code every other cycle. In some embodiments, TDC 302 comprises a plurality of logic gates. Each logic gate of the plurality of logic gates has an input coupled to an output of each multiplexer. In some embodiments, each logic gate includes one of an AND gate, NAND gate, or NOR gate. Bubble suppression can use other digital logic gates too. The plurality of logic gates suppress metastability-induced bubble in the output of the plurality of sequential circuitries. As such, the code is clean from aliasing-based errors.

In some embodiments, TDC 302 couples to a power management unit (PMU) 303. PMU 303 receives the output Code from ADVM 101 and takes appropriate action according to the value of the code. For example, PMU 303 may increase or decrease frequency of a clock of a phase locked loop (PLL), reduce loading conditions (e.g., by postposing or spreading power intensive workloads), etc. In some embodiments, PMU 303 provides the Code to a pin of a processor, accessible by logic outside of the processor. As such, the code can debug various aspects of the processor such as timing errors (e.g., setup/hold timing issues).

Figure 4:
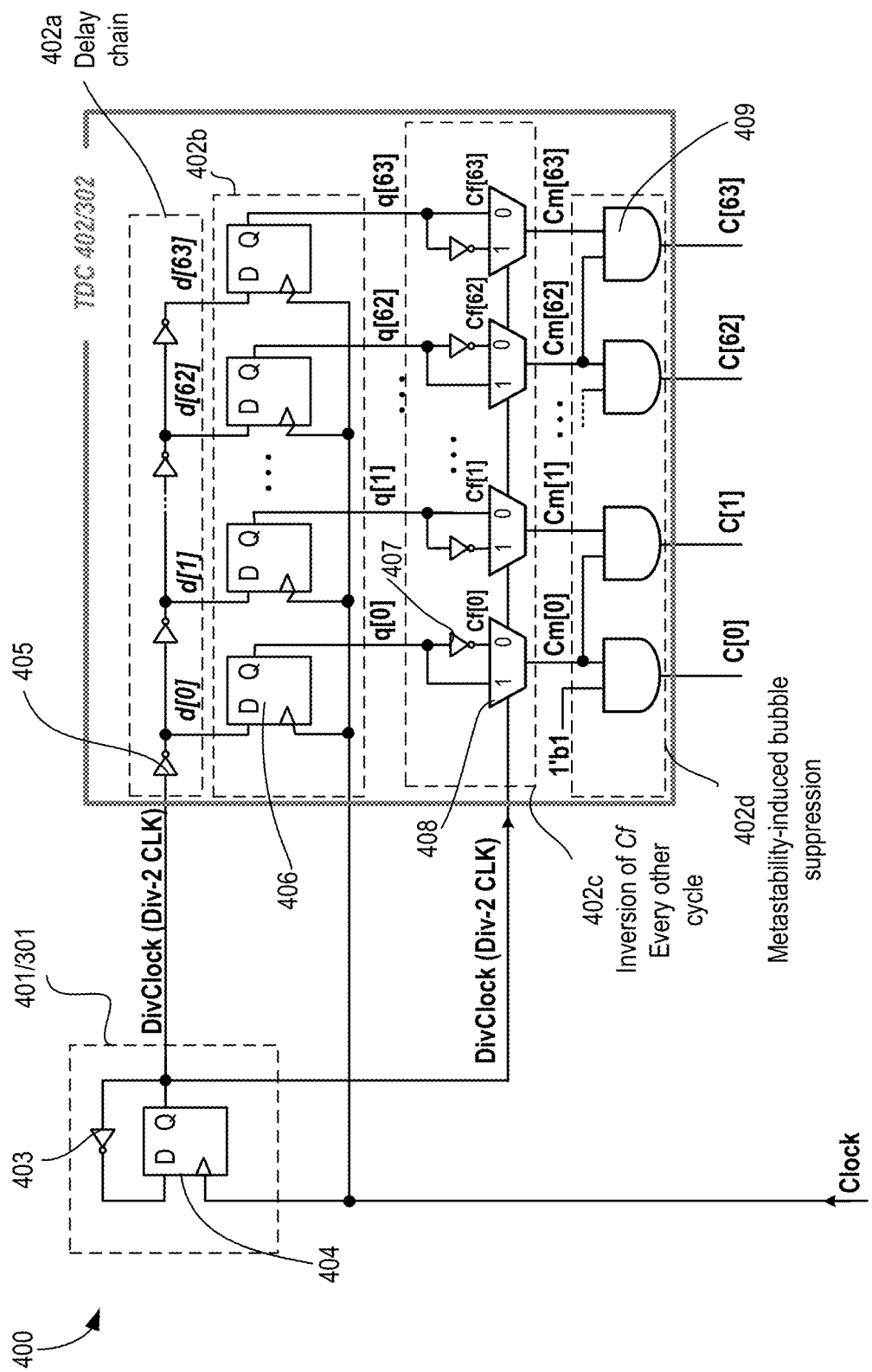
FIG. 4 illustrates a circuit-level implementation of the ADVM, in accordance with some embodiments.

FIG. 4 illustrates a circuit-level implementation 400 of ADVM 101, in accordance with some embodiments. In some embodiments, clock divider 401/301 is a divide-by-two divider that includes an inverter 403 and flip-flop (FF) 404. The output (Q) of FF 404 couples to an input of inverter 403, while an output of inverter 403 couples to an input (D) of FF 404. An input clock pin of FF 404 receives a clock, and the output Q of FF 404 is a divide-by-two (Div-2 Clk) on node DivClk. Here, node names and signal names are interchangeably used. For example, DivClk may refer to node DivClk or signal DivClk depending on the context of the sentence.

In some embodiments, TDC 402/302 comprises a delay chain 402a, a plurality of sequential units 402b, a plurality of selection circuitries 402c, and bubble suppression logic 402d. In some embodiments, delay chain 402a comprises a plurality of delay cells 405. The input of the delay chain 402a is the DivClk. In this example, each delay cell is an inversion logic such as inverter 405. Each delay cell couples to a power supply rail Vcc. As such, propagation delay of each delay cell directly relates to the voltage level of power supply rail Vcc. As the voltage level falls, propagation delay of the delay cell increases, and as the voltage level rises, the propagation delay of the delay cell rises. Each delay cell couples in a string. For instance, the output of the first delay cell couples to an input of the next delay cell, and so on. In this example, FIG. 4 shows 64 delay cells. However, any number of delay cells can be used. Inversion delay cells can be any suitable digital or process scalable delay cells. While an inverter is a simplest form of an inversion delay cell, other cells such as NAND gate, NOR gate, inverting multiplexers etc. can be configured and used as inversion delay cells. These inversion delay cells can be standard cells from a standard-cell library.

In various embodiments, plurality of sequential units 402b includes a plurality of flip-flops (FF) 406. Any suitable flip-flop design can be used for implementing FF 406. For example, FF 406 is a master-slave D-FF, a set-reset based FF, a FF with clock gating, a FF with scan capability, etc. The input D of each FF 406 couples to an output of an inverting delay cell. Each FF 406 uses the Clock as the sampling clock, which is slower in frequency than the frequency of the DivClock. For example, sampling clock is twice as slow as the DivClock. An input by a selection circuitry receives an output q of each FF 406 as shown. Here, 64 FFs 406 are shown that result in 64 outputs q[0], q[1], . . . q[62], and q[63]. Flip-flops 406 sample states of inverters 405 at every rising edge of the domain Clock. For an odd cycle, high-phase of the divided clock (Div-2 CLK) passes through delay chain 402a, and for an even cycle, low-phase of divided clock (Div-2 CLK) passes through delay chain 402a. To generate consistent output codes every domain clock cycle, regardless of the "Div-2 CLK" phase passed to the chain, ADVM 400 uses polarity inversion of the code every other cycle. In some embodiments, simple multiplexors 408 controlled by the divided clock implement polarity inversion of the code every other cycle.

In some embodiments, each selection circuitry of circuitry 402c includes an inversion logic 407 and a multiplexer 408. Inversion logic 407 can be an inverter in its simplest form or may be any other digital inversion logic such as a NAND gate, NOR gate, etc. configured as an inverter. Each multiplexer is controllable by DivClk. For example, when DivClk is high, multiplexer input '1' is provided as output Cm, and when DivClk is low, multiplexer input '0' is provided as output Cm. When delay cells 405 are inversion logic gates, then each multiplexer input '0' and input '1' receives alternating signals. For example, the first multiplexer 408 receives Cf[0] (which is an inversion of q[0]) at its input '0' and q[0] (which is logically equivalent to inversion of Cf[0]) at its input '1', the next multiplexer 408 (e.g., the second multiplexer) receives Cf[1] (which is equivalent to q[1]) at its input '0' and an inversion of q[1] (which is logically equivalent to inversion Cf[1]) at its input '1' and, and so on. DivClock selects Cf[63:0] for Cm[63:0] when it is 0, and inversion of Cf[63:0] when it is 1. Logic gate 409 of the bubble suppression circuitry 402d receives output Cm of each multiplexer. With 402c, the resulting output codes Cm[63:0] become thermometer code. However, any number of multiplexers 408 and 64 inversion logic 407 can be used in accordance with the number of delay cells 405. In general, the number of FF 46, inversion logic gates 407, and multiplexers 408 is equal (or substantially equal) as the number of delay cells 405.

In some embodiments, logic gate 409 is an AND gate. In this case, the first AND gate receives a hard-wired logic '1' value at its first input and Cm[0] at its second input. The next AND gate (e.g., second AND gate) receives Cm[0] at its first input and Cm[1] at its second input, and so on. As such, any flip-flop metastability-induced bubble in the code Cm[0] thorough Cm[63], is suppressed by bubble suppression logic gates 409. While AND gates 409 are shown, these AND gates can be implemented as NAND gates. In this case, 64 AND gate are shown, which is the same number of delay cells 405. The output C of each AND gate together form a bus (e.g., a 64-bit code).

The delay-based voltage monitor 101 of various embodiments applies all-digital standard cells. Therefore, its layout is easily made with industry-standard APR tool(s) without manual design efforts of layout designers. ADVM 400 has fast response time of one cycle latency by passing a "Div-2 CLK" every cycle and inverting polarity of the intermediate code (e.g., Cf[63:0]) every other clock cycle. ADVM 400 is accurate by sampling Vcc for a full cycle, offering improved droop detection resolution. ADVM 400 also has comprehensive HVM (high volume manufacturing) characterization flow, which makes it process-agnostic, and IP-agnostic, enabling rapid development for technology process nodes. While the embodiments are described with reference to 64-bit code that uses 64 AND gates and other logic, the embodiments are not limited to a particular code size. For example, 26, 32, 128, etc. code size can be used that also changes the number of logic gates for ADVM 400.

Figure 5:
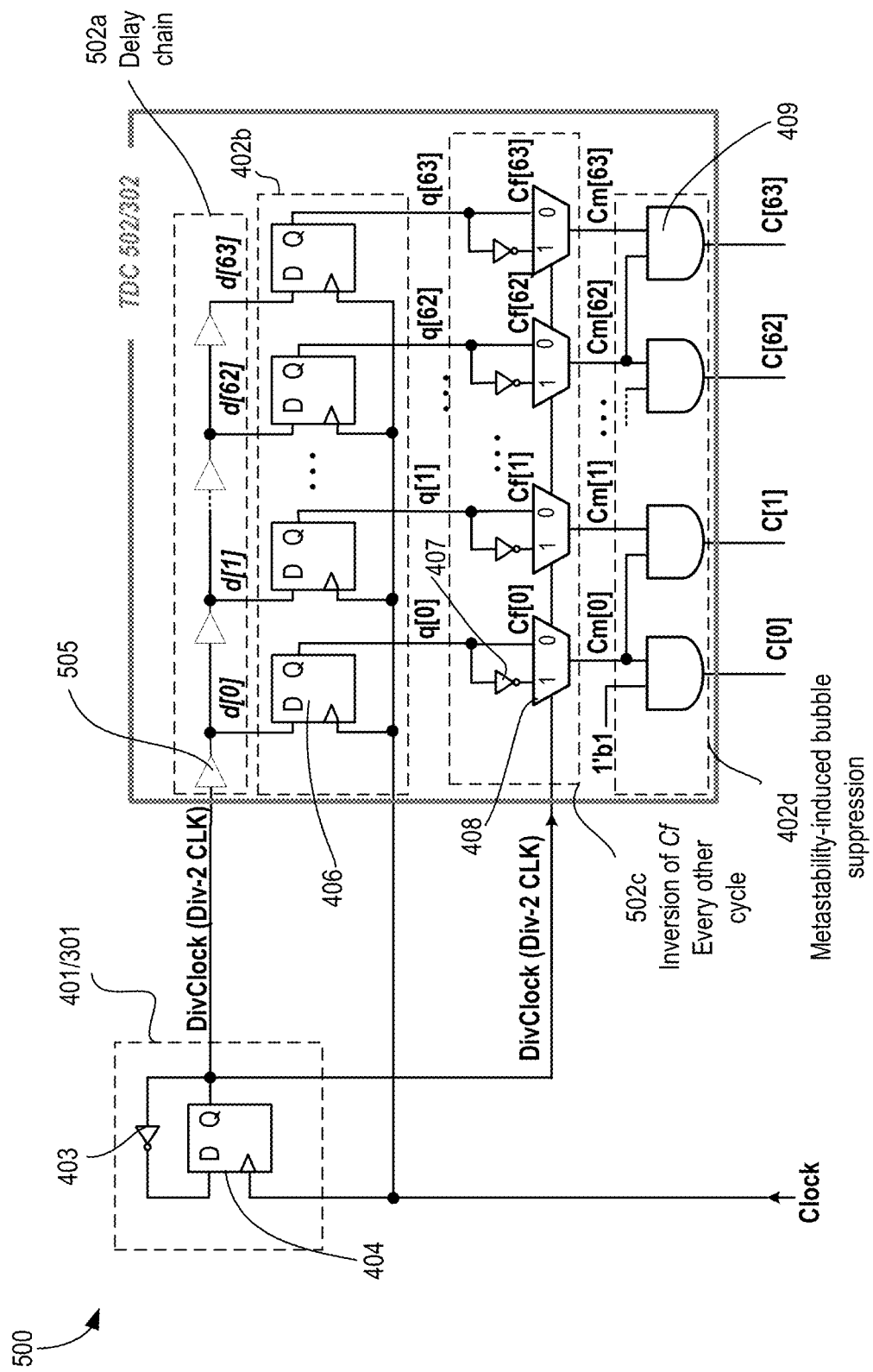
FIG. 5 illustrates a circuit-level implementation of the ADVM, in accordance with some embodiments.

FIG. 5 illustrates a circuit-level implementation of ADVM 500, in accordance with some embodiments. ADVM 500 is similar to ADVM 400 but for a different implementation of delay chain 502a and selection circuitry 502c. In some embodiments, inversion delay cells 405 are replaced with non-inversion delay cells 505. Such non-inversion delay cells 505 include buffers, AND gates, OR gates etc. In this example, non-inversion delay cells 505 are illustrated as buffers. By using buffers 505, the inputs of multiplexer 408 are not alternated as described with reference to FIG. 4. For example, first multiplexer 408 receives Cf[0] (which is equivalent to q[1]) at its input '0' and an inversion of q[0] (which is logically equivalent to inversion Cf[0]) at its input '1', the next multiplexer 408 (e.g., the second multiplexer) also receives Cf[1] (which is equivalent to q[1]) at its input '0' and an inversion of q[1] (which is logically equivalent to inversion Cf[1]) at its input '1', and so on. Technical effect wise, ADVM 500 is similar to ADVM 400.

Figure 6:
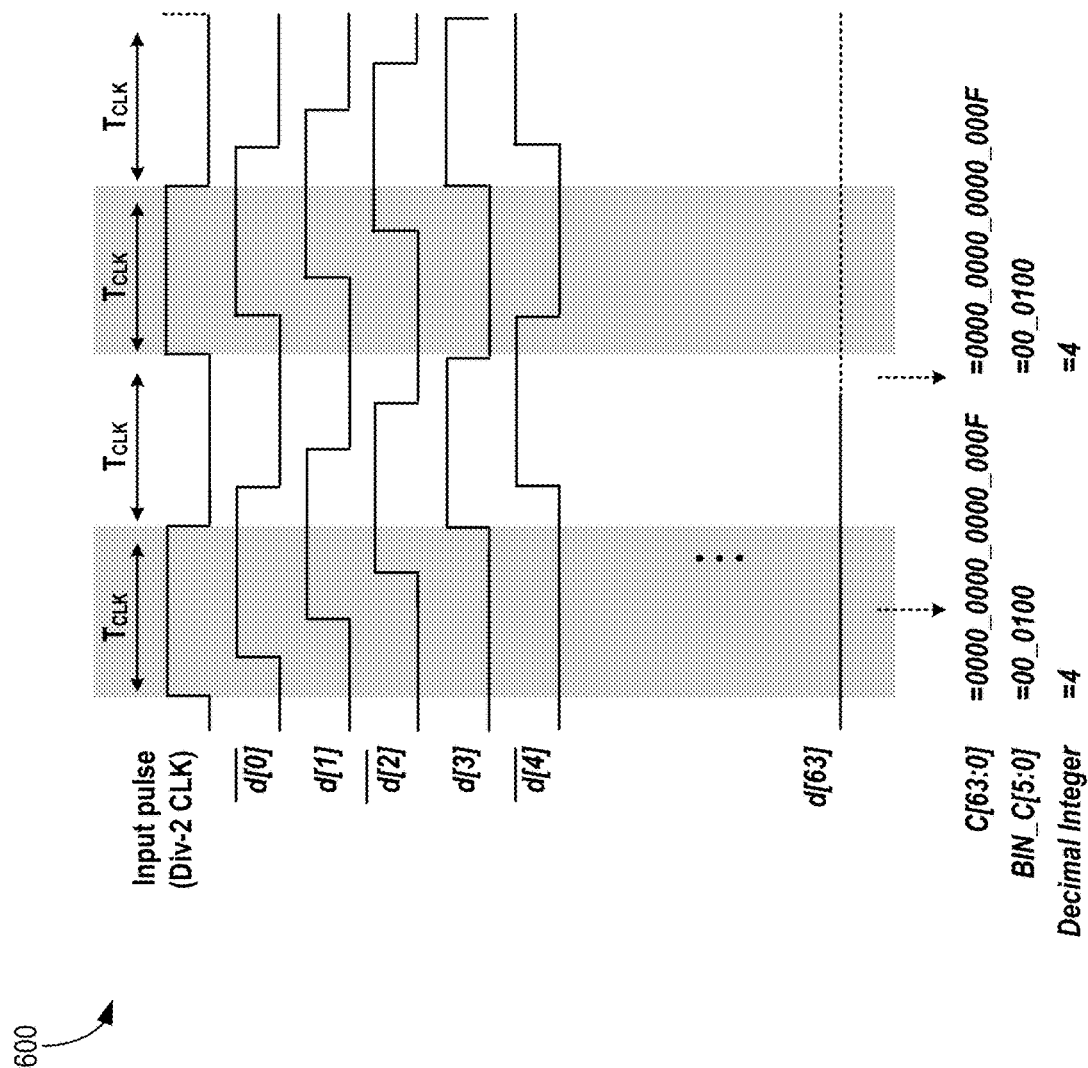
FIG. 6 illustrates a plot showing a timing-diagram of the ADVM, in accordance with some embodiments.

FIG. 6 illustrates plot 600 showing a timing-diagram of the ADVM, in accordance with some embodiments. Plot 600 shows data from each delay cell of delay chain 402a. In this case, the delay cell is an inverter, and the bar over d[0] indicates an inversion of d[0]. Regardless of input pulse phase fed into the ADVM, its output code C[63:0] is consistent. In the example, C[63:0] =0000_0000_0000_000F, which can be encoded into binary code BIN_C[5:0]=00_0100, corresponding to decimal integer of 4.

Figures 7A, 7B:
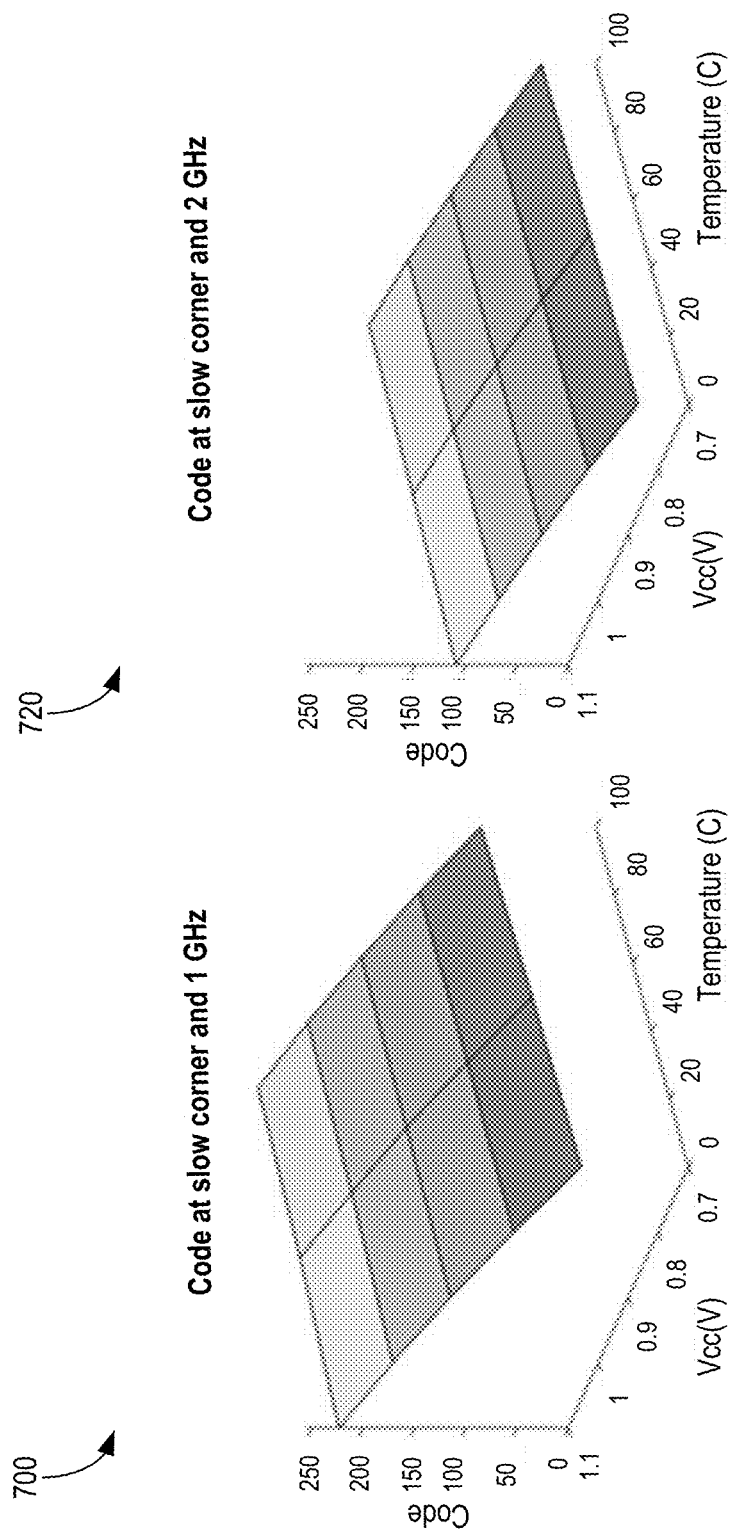
FIGS. 7A-B illustrate plots showing ADVM code changes across Vcc and temperature and different clock frequencies, in accordance with some embodiments.

FIGS. 7A-B illustrate plots 700 and 720, respectively, showing ADVM code changes across Vcc, temperature, and different clock frequencies, in accordance with some embodiments. In some embodiments, the HVM characterization flow is used because ADVM code is sensitive to slow variation due to die process corner (P), current operating voltage (Vcc) including any added voltage guard band, current operating clock frequency (F) where AVDM sampling clock period $T_{CLK}=1/F$, and current temperature (T). FIGS. 7A-B show an example of how ADVM code changes across Vcc and temperature, at a given process corner (e.g., slow corner), and at two frequencies of 1 GHz and 2 GHz, respectively.

Since a given IP block goes through various operating conditions during actual use, one ADVM characterization point may not be enough to compensate for the impact of PVT and F variations on ADVM output code. As a solution, in some embodiments, the HVM characterization flow of ADVM 101 comprises the following two operations. The first operation characterizes ADVM code per die (P_during test) while the second operation, during actual use of ADVM 101, leverages existing PMU of the given IP block to continuously compute the impact of new V, T, F operating point on ADVM code.

In some embodiments, for the first operation, ADVM code is characterized per die (P) during test at M voltage points (V), two temperature points (T) (e.g., hot and code temperatures), and two frequency points (F). The sampled ADVM code are stored in on-die fuses or other non-volatile memory. For example, ADVM codes are stored in (M×2× 2)×log$_2$ (ADVM-chain-length). The ADVM chain length is 64 in FIGS. 4-5.

Referring back to FIGS. 7A-B, for the second operation, during actual use, to leverage exiting power management unit of the given IP, a log continuously computes the impact of a new V, T, F operating point on ADVM code. For example, in approx. 100's of microseconds T changes are captured. In another example, the log continuously computes the impact of a new V, T, F instantly whenever either of V or F changes is executed. In some embodiments, the impact of a new V, T, F operating point on ADVM code is computed through tri-linear interpolation with respect to V, T, and 1/F (where, 1/F is a clock period) based on measured or stored codes from the first operation in the flow.

With the above 2-step flow, any critical decision based on current AVDM code (e.g., kicking off some droop mitigation action) is correctly executed despite variations in P, V, T, and F. Simulation shows that corrected AVDM code with the scheme of various embodiments gives a Vcc monitoring error (e.g., less than 7 mV) across a very wide range of P, V, T, and F.

Figure 8:
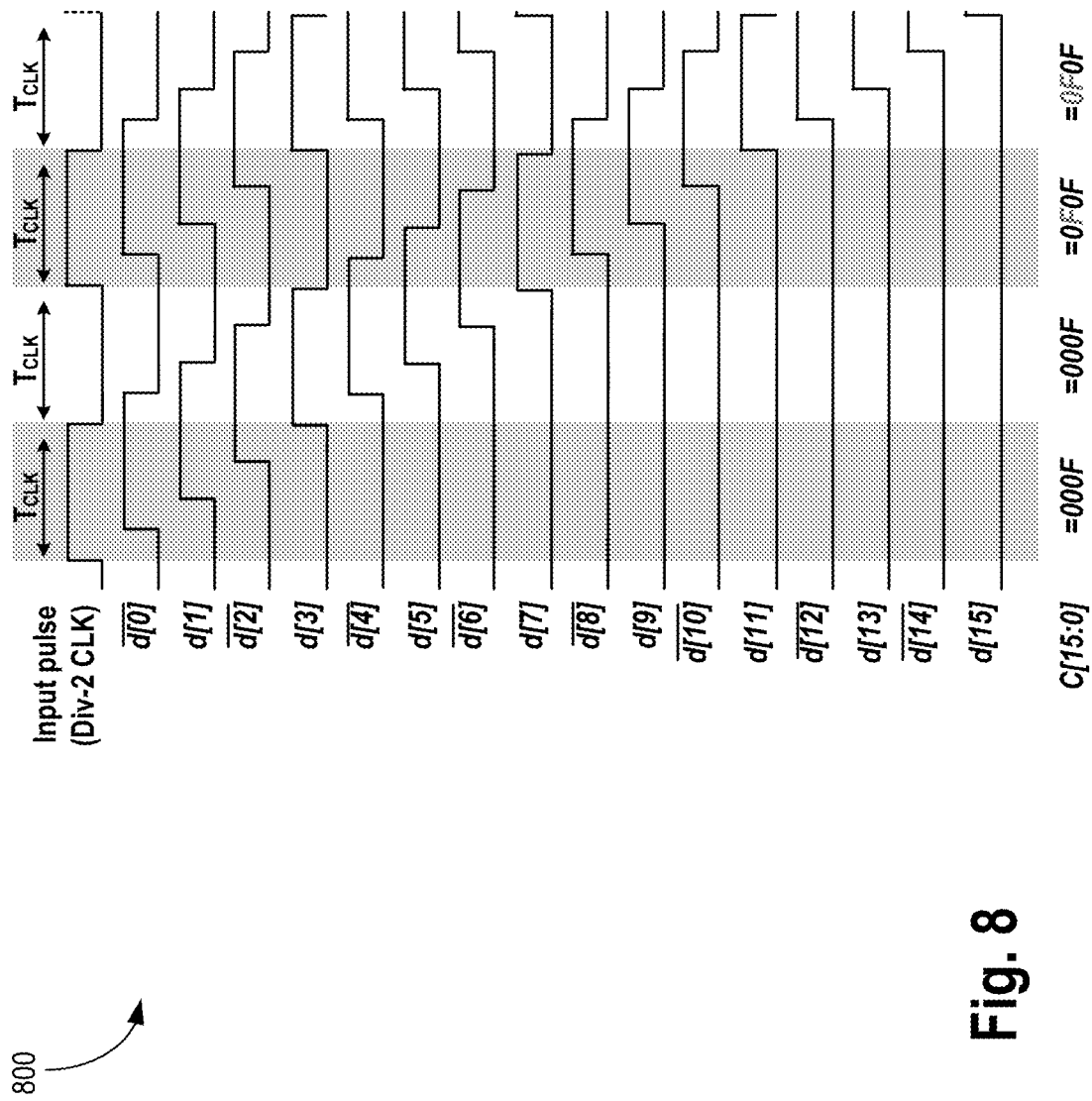
FIG. 8 illustrates a plot showing waveforms of ADVM delay chain inverter states that result in aliasing-code in a thermometer code format, in accordance with some embodiments.

FIG. 8 illustrates plot 800 showing waveforms of the state of ADVM delay chain inverter that results in aliasing-code in thermometer code format, in accordance with some embodiments. In the absence of logic 402d, as discussed herein, ADVM can suffer from code aliasing because it does not have a dedicated reset phase, and instead, pulses of the divided clock DivClock keep propagating through the delay chain, resulting in pulses of previous clock cycles affecting a current output code. It is manifested with long delay chain, and extreme conditions of slow P, low V, low T, and fast F, that leads to satisfying the aliasing condition that $2\times T_{CLK}$ become smaller than total delay across the delay chain. On the other hand, under an extreme condition of fast P, high V, high T, and slow F, a code saturation can happen when using a short delay chain and operating that leads to satisfying the saturation condition that $T_{CLK}$ become larger than total delay across delay chain 402a (or 502a). Both code aliasing and saturation are exaggerated with the elimination of tunable gate delay in ADVM.

Plot 800 shows how 16-bit ADVM output code ends up with aliasing. Assuming the voltage state does not state over 4 consecutive cycles, the first two captured code are 000F as desired, but the next two codes becomes 0F0F, and the MSB (most significant bit) 0F is due to the previous pulse that was still propagating through the chain.

To deal with the conflicting aliasing and saturation conditions, one approach is to use the minimum delay chain length (e.g. 128b or 256b) needed to prevent saturation under worst-case (saturation) operating condition for the given IP block, and then detect and correct for aliasing when it happens.

The following embodiments describe three different schemes to detect and correct for ADVM code aliasing.

In the first method or scheme, the aliasing code issue is resolved by generating and fusing an aliasing-masking-code during HVM characterization phase, and providing the aliasing-masking-code to ADVM 101 to filter out the aliasing-code by performing bit-wise AND operation between the raw output code and the masking-code. For the example in plot 800, where Original-CODE [15:0]=0x0F0F (where 0x indicates hexadecimal number representation, and most significant "0F" is the result of aliasing), Masking-CODE [15:0]=0x00FF is generated under worst-case condition, and Filtered-CODE [15:0] is made equal to Original-CODE "&" Masking-CODE=000F, where "&" indicates bit-wise and operation.

In the second method or scheme, the solution to correct aliasing code issue may not use additional manufacturing efforts, and utilizes parallel thermometer-to-binary-code encoders. These parallel thermometer-to-binary-code encodes encode the least significant $2^K-1$ bits of the thermometer codes to K-bit binary codes, where K can take the values E, E+1, ..., E+N−1, for N>1, by summing all the individual bits of a thermometer code to encode into a binary code. Then, by examining each of the K-bit binary codes (where K=E, E+1, ..., E+N−1, and N>1), a fast code-post-processing Aliasing Correction Logic (ACL) decides whether there exists an aliased code, and which K-bit binary code should be taken for voltage monitoring. The ACL examines all the binary codes, and finds saturated binary codes. If K-bit binary codes, where E≤K≤S, are all saturated, and if E≤S<E+N−1, then the ACL takes (S+1)-bit binary code for voltage monitoring code. If S=E+N−1, then the ACL takes S-bit binary code, and it sends "emergency" warning to PMU 303 to indicate code saturation.

In an example of 32b code, where C[31:0] =0x000F_FFFF, three binary-code encoders are used with E=3, and N=3, to respectively encode the least significant 8-bit, 16-bit, and 32-bit of the thermometer codes to 3-bit, 4-bit, and 5-bit binary code. The three encoded binary codes are respectively, $111_2$ (=7), $1111_2$ (=15), and $1\_0100_2$ (=20). The ACL examines the binary outputs of $111_2$, and $1111_2$, and informs that they are saturated (S=4), so it takes the 5-bit binary code as voltage monitoring code. Similarly, when C[31:0]=0xFF00_0FFF, the code has aliasing of "FF" in the most-significant bits (MSBs), and the ACL filters out the aliasing-code "FF", the encoders generate $111_2$ (=3), $1100_2$ (=12), and the ACL examines them. In this case, merely the 3-bit binary code of $111_2$ is saturated, so the ACL takes the 4-bit binary code of $1100_2$ for voltage monitoring code, ignoring the 5-bit binary code, and filtering out the aliasing-code.

In the third method or scheme, the solution to correct aliasing may not use additional manufacturing efforts unlike the first method, and uses multiple parallel encoders like in the second method albeit uniform size. In this method, to process $2^K-1$ bits of the thermometer codes (e.g. $T[(2^K-2):0]$) to K-bit binary codes, the scheme utilizes P units of parallel thermometer-to-binary-code encoders that each encodes 2E thermometer codes to (E+1)-bit binary codes, where K=E+P. If each of the encoders encodes a non-overlapping and continuous $2^E$-bit segment (where a segment can be $T[2^E-1:0]$, $T[(2 \times 2^E-1):2^E]$, $T[(2^K-2):(P-1) \times 2^E])$ from the original thermometer code (e.g. $T[(2^K-2):0]$), then a fast post-processing ACL can decide whether there exists an aliased code, and generates a final binary code.

If the outputs of all of the Q encoders that encode the lower $Q \times 2^E$-bit of the thermometer code (e.g. $T[(Q \times 2^E-1):0]$) are saturated, and if Q is not equal to P, the ACL sums outputs from the Q encoder to generate final K-bit code. If Q is equal to P, then the ACL generates $2^K-1$ (or saturation) in the final binary code, and it sends "emergency" warning to PMU 303. For example, for 127-bit thermometer CODE [126:0] =0x0600_0000_0000_0000_FFFF_FFFF_FFFF_FFFF, four 6-bit binary codes are used for CODE [126:96], CODE [95:64], CODE [63:32], CODE [31:0], respectively. Then, the 6-bit binary encoded outputs are respectively 2, 0, 32, and 32. By having the ACL detect that CODE [63:32] & CODE [31:0] are saturated, and CODE [95:64] is not, the final binary code as 0+32+32=64 is generated correctly.

The following is a design flow for ADVM 101. First, replace standard cells in a reference ADVM design with target library standard cells. Second, perform functionality check with SPICE simulation. Third, convert schematic to Verilog or any other hardware description language. Four, perform APR with parametrized script for symmetric dedicated placement of delay cells, and other gates in equidistance. Five, perform synthesis/APR of code post-processing units such as thermometer-to-binary-code encoder with aliasing correction logic.

Figure 9:
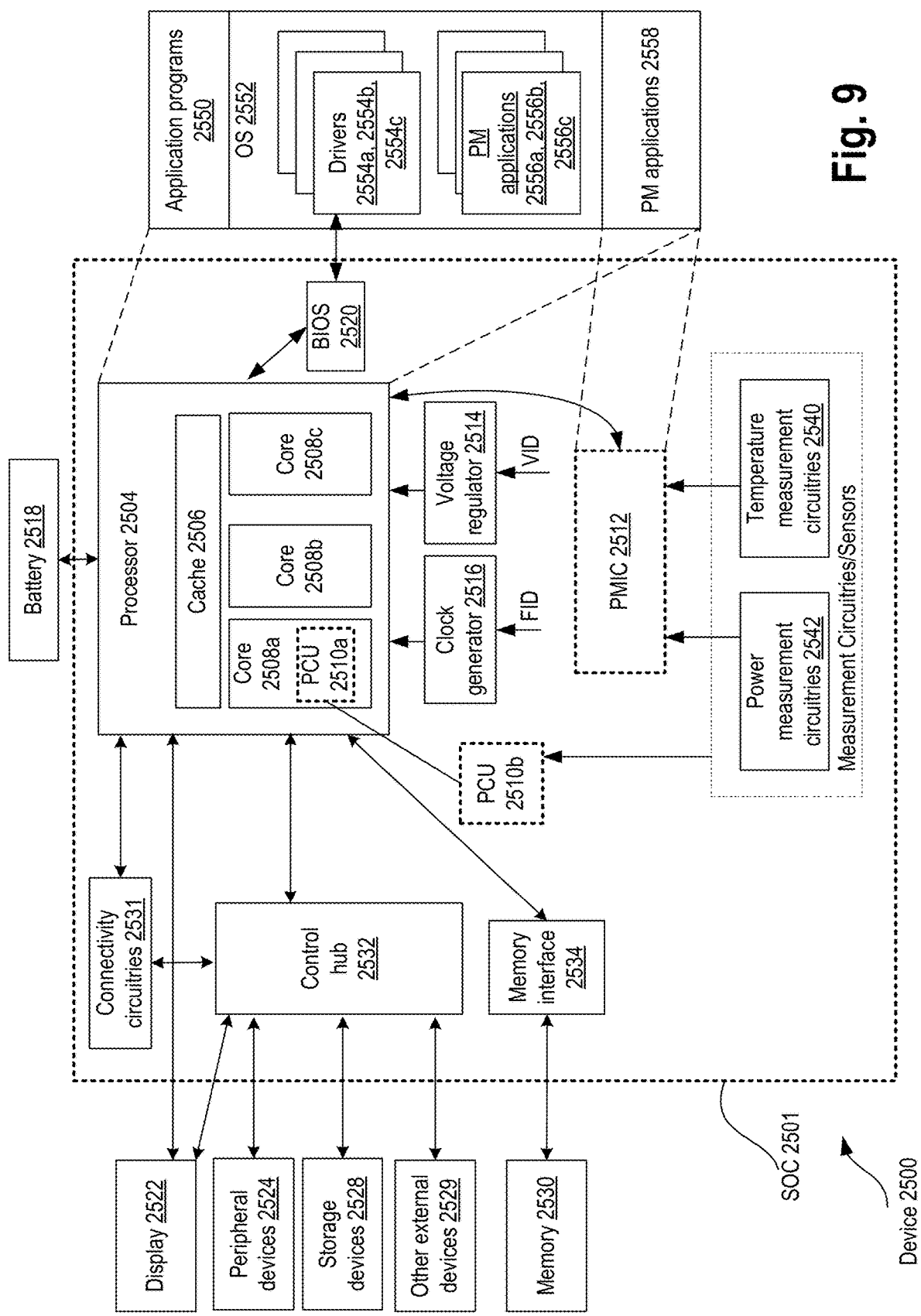
FIG. 9 illustrates a smart device, or a computer system, or a SoC (System-on-Chip) with ADVM, according to some embodiments of the disclosure.

FIG. 9 illustrates a smart device, or a computer system, or a SoC (System-on-Chip) with ADVM, according to some embodiments of the disclosure. In some embodiments, device 2500 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2500. Any components here can have ADVM in accordance with the various embodiments.

In an example, the device 2500 comprises a SoC (System-on-Chip) 2501. An example boundary of the SOC 2501 is illustrated using dotted lines in FIG. 9, with some example components being illustrated to be included within SOC 2501—however, SOC 2501 may include any appropriate components of device 2500.

In some embodiments, device 2500 includes processor 2504. Processor 2504 can include one or more physical devices, such as microprocessors, application processors, microcontrollers, programmable logic devices, processing cores, or other processing means. The processing operations performed by processor 2504 include the execution of an operating platform or operating system on which applications and/or device functions are executed. The processing operations include operations related to I/O (input/output) with a human user or with other devices, operations related to power management, operations related to connecting computing device 2500 to another device, and/or the like. The processing operations may also include operations related to audio I/O and/or display I/O.

In some embodiments, processor 2504 includes multiple processing cores (also referred to as cores) 2508a, 2508b, 2508c. Although merely three cores 2508a, 2508b, 2508c are illustrated, processor 2504 may include any other appropriate number of processing cores, e.g., tens, or even hundreds of processing cores. Processor cores 2508a, 2508b, 2508c may be implemented on a single integrated circuit (IC) chip. Moreover, the chip may include one or more shared and/or private caches, buses or interconnections, graphics and/or memory controllers, or other components.

In some embodiments, processor 2504 includes cache 2506. In an example, sections of cache 2506 may be dedicated to individual cores 2508 (e.g., a first section of cache 2506 dedicated to core 2508a, a second section of cache 2506 dedicated to core 2508b, and so on). In an example, one or more sections of cache 2506 may be shared among two or more of cores 2508. Cache 2506 may be split in different levels, e.g., level 1 (L1) cache, level 2 (L2) cache, level 3 (L3) cache, etc.

In some embodiments, processor core 2504 may include a fetch unit to fetch instructions (including instructions with conditional branches) for execution by the core 2504. The instructions may be fetched from any storage devices such as the memory 2530. Processor core 2504 may also include a decode unit to decode the fetched instruction. For example, the decode unit may decode the fetched instruction into a plurality of micro-operations. Processor core 2504 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2504 may be an out-of-order processor core in one embodiment. Processor core 2504 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 2504 may also include a bus unit to enable communication between components of the processor core 2504 and other components via one or more buses. Processor core 2504 may also include one or more registers to store data accessed by various components of the core 2504 (such as values related to assigned app priorities and/or sub-system states (modes) association.

In some embodiments, device 2500 comprises connectivity circuitries 2531. For example, connectivity circuitries 2531 includes hardware devices (e.g., wireless and/or wired connectors and communication hardware) and/or software components (e.g., drivers, protocol stacks), e.g., to enable device 2500 to communicate with external devices. Device 2500 may be separate from the external devices, such as other computing devices, wireless access points or base stations, etc.

In an example, connectivity circuitries 2531 may include multiple different types of connectivity. To generalize, the connectivity circuitries 2531 may include cellular connectivity circuitries, wireless connectivity circuitries, etc. Cellular connectivity circuitries of connectivity circuitries 2531 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2531 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2531 may include a network interface, such as a wired or wireless interface, e.g., so that a system embodiment may be incorporated into a wireless device, for example, cell phone or personal digital assistant.

In some embodiments, device 2500 comprises control hub 2532, which represents hardware devices and/or software components related to interaction with one or more I/O devices. For example, processor 2504 may communicate with one or more of display 2522, one or more peripheral devices 2524, storage devices 2528, one or more other external devices 2529, etc., via control hub 2532. Control hub 2532 may be a chipset, a Platform Control Hub (PCH), and/or the like.

For example, control hub 2532 illustrates one or more connection points for additional devices that connect to device 2500, e.g., through which a user might interact with the system. For example, devices (e.g., devices 2529) that can be attached to device 2500 include microphone devices, speaker or stereo systems, audio devices, video systems or other display devices, keyboard or keypad devices, or other I/O devices for use with specific applications such as card readers or other devices.

As mentioned above, control hub 2532 can interact with audio devices, display 2522, etc. For example, input through a microphone or other audio device can provide input or commands for one or more applications or functions of device 2500. Additionally, audio output can be provided instead of, or in addition to display output. In another example, if display 2522 includes a touch screen, display 2522 also acts as an input device, which can be at least partially managed by control hub 2532. There can also be additional buttons or switches on computing device 2500 to provide I/O functions managed by control hub 2532. In one embodiment, control hub 2532 manages devices such as accelerometers, cameras, light sensors or other environmental sensors, or other hardware that can be included in device 2500. The input can be part of direct user interaction, as well as providing environmental input to the system to influence its operations (such as filtering for noise, adjusting displays for brightness detection, applying a flash for a camera, or other features).

In some embodiments, control hub 2532 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2522 represents hardware (e.g., display devices) and software (e.g., drivers) components that provide a visual and/or tactile display for a user to interact with device 2500. Display 2522 may include a display interface, a display screen, and/or hardware device used to provide a display to a user. In some embodiments, display 2522 includes a touch screen (or touch pad) device that provides both output and input to a user. In an example, display 2522 may communicate directly with the processor 2504. Display 2522 can be one or more of an internal display device, as in a mobile electronic device or a laptop device or an external display device attached via a display interface (e.g., DisplayPort, etc.). In one embodiment display 2522 can be a head mounted display (HMD) such as a stereoscopic display device for use in virtual reality (VR) applications or augmented reality (AR) applications.

In some embodiments and although not illustrated in the figure, in addition to (or instead of) processor 2504, device 2500 may include Graphics Processing Unit (GPU) comprising one or more graphics processing cores, which may control one or more aspects of displaying contents on display 2522.

Control hub 2532 (or platform controller hub) may include hardware interfaces and connectors, as well as software components (e.g., drivers, protocol stacks) to make peripheral connections, e.g., to peripheral devices 2524.

It will be understood that device 2500 could both be a peripheral device to other computing devices, as well as have peripheral devices connected to it. Device 2500 may have a "docking" connector to connect to other computing devices for purposes such as managing (e.g., downloading and/or uploading, changing, synchronizing) content on device 2500. Additionally, a docking connector can allow device 2500 to connect to certain peripherals that allow computing device 2500 to control content output, for example, to audiovisual or other systems.

In addition to a proprietary docking connector or other proprietary connection hardware, device 2500 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2531 may be coupled to control hub 2532, e.g., in addition to, or instead of, being coupled directly to the processor 2504. In some embodiments, display 2522 may be coupled to control hub 2532, e.g., in addition to, or instead of, being coupled directly to processor 2504.

In some embodiments, device 2500 comprises memory 2530 coupled to processor 2504 via memory interface 2534. Memory 2530 includes memory devices for storing information in device 2500. Memory can include nonvolatile (state does not change if power to the memory device is interrupted) and/or volatile (state is indeterminate if power to the memory device is interrupted) memory devices. Memory device 2530 can be a dynamic random access memory (DRAM) device, a static random access memory (SRAM) device, flash memory device, phase-change memory device, or some other memory device having suitable performance to serve as process memory. In one embodiment, memory 2530 can operate as system memory for device 2500, to store data and instructions for use when the one or more processors 2504 executes an application or process. Memory 2530 can store application data, user data, music, photos, documents, or other data, as well as system data (whether long-term or temporary) related to the execution of the applications and functions of device 2500.

Elements of various embodiments and examples are also provided as a machine-readable medium (e.g., memory 2530) for storing the computer-executable instructions (e.g., instructions to implement any other processes discussed herein). The machine-readable medium (e.g., memory 2530) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2500 comprises temperature measurement circuitries 2540, e.g., for measuring temperature of various components of device 2500. In an example, temperature measurement circuitries 2540 may be embedded, or coupled or attached to various components, whose temperature are to be measured and monitored. For example, temperature measurement circuitries 2540 may measure temperature of (or within) one or more of cores 2508*a*, 2508*b*, 2508*c*, voltage regulator 2514, memory 2530, a mother-board of SOC 2501, and/or any appropriate component of device 2500.

In some embodiments, device 2500 comprises power measurement circuitries 2542, e.g., for measuring power consumed by one or more components of the device 2500. In an example, in addition to, or instead of, measuring power, the power measurement circuitries 2542 may measure voltage and/or current. In an example, the power measurement circuitries 2542 may be embedded, or coupled or attached to various components, whose power, voltage, and/or current consumption are to be measured and monitored. For example, power measurement circuitries 2542 may measure power, current and/or voltage supplied by one or more voltage regulators 2514, power supplied to SOC 2501, power supplied to device 2500, power consumed by processor 2504 (or any other component) of device 2500, etc.

In some embodiments, device 2500 comprises one or more voltage regulator circuitries, generally referred to as voltage regulator (VR) 2514 VR having a high bandwidth and low power differential-to-single-ended type-III compensator. VR 2514 generates signals at appropriate voltage levels, which may be supplied to operate any appropriate components of the device 2500. Merely as an example, VR 2514 is illustrated to be supplying signals to processor 2504 of device 2500. In some embodiments, VR 2514 receives one or more Voltage Identification (VID) signals, and generates the voltage signal at an appropriate level, based on the VID signals. Various type of VRs may be utilized for the VR 2514. For example, VR 2514 may include a "buck" VR, "boost" VR, a combination of buck and boost VRs, low dropout (LDO) regulators, switching DC-DC regulators, etc.

Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 2510a/b and/or PMIC 2512. In some embodiments, each core has a network of distributed LDOs to provide efficient control for power management. The LDOs can be digital, analog, or a combination of digital or analog LDOs. The VR is an adaptive VR that can provide an adaptive voltage output as discussed with reference to various embodiments.

In some embodiments, device 2500 comprises one or more clock generator circuitries, generally referred to as clock generator 2516. Clock generator 2516 generates clock signals at appropriate frequency levels, which may be supplied to any appropriate components of device 2500. Merely as an example, clock generator 2516 is illustrated to be supplying clock signals to processor 2504 of device 2500. In some embodiments, clock generator 2516 receives one or more Frequency Identification (FID) signals, and generates the clock signals at an appropriate frequency, based on the FID signals. Clock generator 2516 is an adaptive clock source that can provide an adaptive frequency output as discussed with reference to various embodiments.

In some embodiments, device 2500 comprises battery 2518 supplying power to various components of device 2500. Merely as an example, battery 2518 is illustrated to be supplying power to processor 2504. Although not illustrated in the figures, device 2500 may comprise a charging circuitry, e.g., to recharge the battery, based on Alternating Current (AC) power supply received from an AC adapter.

In some embodiments, device 2500 comprises Power Control Unit (PCU) 2510 (also referred to as Power Management Unit (PMU), Power Controller, etc.). In an example, some sections of PCU 2510 may be implemented by one or more processing cores 2508, and these sections of PCU 2510 are symbolically illustrated using a dotted box and labelled PCU 2510a. In an example, some other sections of PCU 2510 may be implemented outside the processing cores 2508, and these sections of PCU 2510 are symbolically illustrated using a dotted box and labelled as PCU 2510b. PCU 2510 may implement various power management operations for device 2500. PCU 2510 may include hardware interfaces, hardware circuitries, connectors, registers, etc., as well as software components (e.g., drivers, protocol stacks), to implement various power management operations for device 2500.

In some embodiments, device 2500 comprises Power Management Integrated Circuit (PMIC) 2512, e.g., to implement various power management operations for device 2500. In some embodiments, PMIC 2512 is a Reconfigurable Power Management ICs (RPMICs) and/or an IMVP (Intel® Mobile Voltage Positioning). In an example, the PMIC is within an IC chip separate from processor 2504. The may implement various power management operations for device 2500. PMIC 2512 may include hardware interfaces, hardware circuitries, connectors, registers, etc., as well as software components (e.g., drivers, protocol stacks), to implement various power management operations for device 2500.

In an example, device 2500 comprises one or both PCU 2510 or PMIC 2512. In an example, any one of PCU 2510 or PMIC 2512 may be absent in device 2500, and hence, these components are illustrated using dotted lines.

Various power management operations of device 2500 may be performed by PCU 2510, by PMIC 2512, or by a combination of PCU 2510 and PMIC 2512. For example, PCU 2510 and/or PMIC 2512 may select a power state (e.g., P-state) for various components of device 2500. For example, PCU 2510 and/or PMIC 2512 may select a power state (e.g., in accordance with the ACPI (Advanced Configuration and Power Interface) specification) for various components of device 2500. Merely as an example, PCU 2510 and/or PMIC 2512 may cause various components of the device 2500 to transition to a sleep state, to an active state, to an appropriate C state (e.g., C0 state, or another appropriate C state, in accordance with the ACPI specification), etc. In an example, PCU 2510 and/or PMIC 2512 may control a voltage output by VR 2514 (e.g., SCVR) and/or a frequency of a clock signal output by the clock generator, e.g., by outputting the VID signal and/or the FID signal, respectively. In an example, PCU 2510 and/or PMIC 2512 may control battery power usage, charging of battery 2518, and features related to power saving operation.

The clock generator 2516 can comprise a phase locked loop (PLL), frequency locked loop (FLL), or any suitable clock source. In some embodiments, each core of processor 2504 has its own clock source. As such, each core can operate at a frequency independent of the frequency of operation of the other core. In some embodiments, PCU 2510 and/or PMIC 2512 performs adaptive or dynamic frequency scaling or adjustment. For example, clock frequency of a processor core can be increased if the core is not operating at its maximum power consumption threshold or limit. In some embodiments, PCU 2510 and/or PMIC 2512 determines the operating condition of each core of a processor, and opportunistically adjusts frequency and/or power supply voltage of that core without the core clocking source (e.g., PLL of that core) losing lock when the PCU 2510 and/or PMIC 2512 determines that the core is operating below a target performance level. For example, if a core is drawing current from a power supply rail less than a total current allocated for that core or processor 2504, then PCU 2510 and/or PMIC 2512 can temporality increase the power draw for that core or processor 2504 (e.g., by increasing clock frequency and/or power supply voltage level) so that the core or processor 2504 can perform at higher performance level. As such, voltage and/or frequency can be increased temporality for processor 2504 without violating product reliability.

In an example, PCU 2510 and/or PMIC 2512 may perform power management operations, e.g., based at least in part on receiving measurements from power measurement circuitries 2542, temperature measurement circuitries 2540, charge level of battery 2518, and/or any other appropriate information that may be used for power management. To that end, PMIC 2512 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2510 and/or PMIC 2512 in at least one embodiment to allow PCU 2510 and/or PMIC 2512 to manage processor core energy at least in part based on value(s) detected by one or more of the sensors.

Also illustrated is an example software stack of device 2500 (although not all elements of the software stack are illustrated). Merely as an example, processors 2504 may execute application programs 2550, Operating System 2552, one or more Power Management (PM) specific application programs (e.g., generically referred to as PM applications 2558), and/or the like. PM applications 2558 may also be executed by the PCU 2510 and/or PMIC 2512. OS 2552 may also include one or more PM applications 2556a, 2556b, 2556c. The OS 2552 may also include various drivers 2554a, 2554b, 2554c, etc., some of which may be specific for power management purposes. In some embodiments, device 2500 may further comprise a Basic Input/Output System (BIOS) 2520. BIOS 2520 may communicate with OS 2552 (e.g., via one or more drivers 2554), communicate with processors 2504, etc.

For example, one or more of PM applications 2558, 2556, drivers 2554, BIOS 2520, etc. may be used to implement power management specific tasks, e.g., to control voltage and/or frequency of various components of device 2500, to control wake-up state, sleep state, and/or any other appropriate power state of various components of device 2500, control battery power usage, charging of the battery 2518, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1

An apparatus comprising: a frequency divider to receive an input clock and to generate a frequency divided clock; a delay chain comprising delay cells, wherein the delay chain is to receive the frequency divided clock at an input of the delay chain; a plurality of sequential circuitries, wherein each of the sequential circuitries is coupled to an output of an individual delay cell of the delay chain; and a selection circuitry coupled to the plurality of sequential circuitries, wherein the selection circuitry includes a multiple of multiplexers, wherein each multiplexer is coupled to an individual sequential circuitry of the plurality of sequential circuitries.

Example 2

The apparatus of claim 1 comprises a circuitry to suppress metastability-induced bubble in outputs of the selection circuitry.

Example 3

The apparatus of claim 2 wherein the circuitry comprises a plurality of logic gates, wherein each logic gate has an input coupled to an output of each multiplexer.

Example 4

The apparatus of claim 3, wherein each logic gate includes one of: an AND gate, NAND gate, or NOR gate.

Example 5

The apparatus of claim 3, wherein the plurality of logic gate generate a thermometer code.

Example 6

The apparatus of claim 1, wherein the each of the sequential circuitries receives the input clock.

Example 7

The apparatus of claim 1, wherein each multiplexer is controllable by the frequency divided clock, and wherein each multiplexer is to provide one of an output of the individual sequential circuitry or an inversion of the output of the individual sequential circuitry.

Example 8

The apparatus of claim 1, wherein each delay cell of the delay chain comprises an inversion logic.

Example 9

The apparatus of claim 8, wherein the inversion logic includes one of an inverter, NAND gate, or NOR gate.

Example 10

The apparatus of claim 1, wherein each delay cell of the delay chain comprises a non-inversion logic.

Example 11

The apparatus of claim 10, wherein the non-inversion logic includes one of: a buffer, an AND gate, or an OR gate.

Example 12

The apparatus of claim 1, wherein the frequency divider comprises a flip-flop and an inverter coupled to an input and output of the flip-flop.

Example 13

The apparatus of claim 1, wherein the frequency divided clock is a divided-by2 clock.

Example 14

The apparatus of claim 2, wherein the delay chain is coupled to: a power supply node whose voltage is monitored by the delay chain, the plurality of sequential circuitries, selection circuitry, and the circuitry.

Example 15

An apparatus comprising: a frequency divider to receive an input clock and to generate a frequency divided clock; and a time-to-digital converter (TDC) coupled to the frequency divider and to a power supply node whose voltage level is to be monitored, wherein the TDC has a latency of one cycle of the input clock.

Example 16

The apparatus of claim 15, wherein the TDC comprises: a delay chain comprising delay cells, wherein the delay chain is to receive the frequency divided clock at an input of the delay chain; a plurality of sequential circuitries, wherein each of the sequential circuitries is coupled to an output of an individual delay cell of the delay chain; and a selection circuitry coupled to the plurality of sequential circuitries, wherein the selection circuitry includes a multiple of multiplexers, wherein each multiplexer is coupled to an individual sequential circuitry of the plurality of sequential circuitries.

Example 17

The apparatus of claim 16 wherein the TDC comprises a plurality of logic gates, wherein each logic gate has an input coupled to an output of each multiplexer, wherein each logic gate includes one of: an AND gate, NAND gate, or NOR gate.

Example 18

A system comprising: a memory; a processor coupled to the memory, wherein the processor includes a power management logic coupled to a time-to-digital converter (TDC), wherein the TDC is coupled to a frequency divider and to a power supply node whose voltage level is to be monitored, wherein the TDC has a latency of one cycle of the input clock, wherein the frequency divider to receive an input clock and to generate a frequency divided clock; and a wireless interface to allow the processor to communicate with another device.

Example 19

The system of claim 18, wherein the TDC comprises: a delay chain comprising delay cells, wherein the delay chain is to receive the frequency divided clock at an input of the delay chain; a plurality of sequential circuitries, wherein each of the sequential circuitries is coupled to an output of an individual delay cell of the delay chain; and a selection circuitry coupled to the plurality of sequential circuitries, wherein the selection circuitry includes a multiple of multiplexers, wherein each multiplexer is coupled to an individual sequential circuitry of the plurality of sequential circuitries.

Example 20

The system of claim 18, wherein the TDC comprises a plurality of logic gates, wherein each logic gate has an input coupled to an output of each multiplexer, wherein each logic gate includes one of: an AND gate, NAND gate, or NOR gate.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
    a frequency divider to receive an input clock and to generate a frequency divided clock;
    a delay chain comprising delay cells, wherein the delay chain is to receive the frequency divided clock at an input of the delay chain;
    a plurality of sequential circuitries, wherein each of the sequential circuitries is coupled to an output of an individual delay cell of the delay chain; and
    a selection circuitry coupled to the plurality of sequential circuitries, wherein the selection circuitry includes a multiple of multiplexers, wherein each multiplexer is coupled to an individual sequential circuitry of the plurality of sequential circuitries.

2. The apparatus of claim 1 comprises a circuitry to suppress metastability-induced bubble in outputs of the selection circuitry.

3. The apparatus of claim 2 wherein the circuitry comprises a plurality of logic gates, wherein each logic gate has an input coupled to an output of each multiplexer.

4. The apparatus of claim 3, wherein each logic gate includes one of: an AND gate, NAND gate, or NOR gate.

5. The apparatus of claim 3, wherein the plurality of logic gate is to generate a thermometer code.

6. The apparatus of claim 1, wherein the each of the sequential circuitries is to receive the input clock.

7. The apparatus of claim 1, wherein each multiplexer is controllable by the frequency divided clock, and wherein each multiplexer is to provide one of an output of the individual sequential circuitry or an inversion of the output of the individual sequential circuitry.

8. The apparatus of claim 1, wherein each delay cell of the delay chain comprises an inversion logic.

9. The apparatus of claim 8, wherein the inversion logic includes one of an inverter, NAND gate, or NOR gate.

10. The apparatus of claim 1, wherein each delay cell of the delay chain comprises a non-inversion logic.

11. The apparatus of claim 10, wherein the non-inversion logic includes one of: a buffer, an AND gate, or an OR gate.

12. The apparatus of claim 1, wherein the frequency divider comprises a sequential circuit and an inverter coupled to an input and output of the sequential circuit.

13. The apparatus of claim 1, wherein the frequency divided clock is a divided-by2 clock.

14. The apparatus of claim 2, wherein the delay chain is coupled to: a power supply node whose voltage is monitored by the delay chain, the plurality of sequential circuitries, selection circuitry, and the circuitry.

15. An apparatus comprising:
a frequency divider to receive an input clock and to generate a frequency divided clock; and
a time-to-digital converter (TDC) coupled to the frequency divider and to a power supply node whose voltage level is to be monitored, wherein the TDC has a latency of one cycle of the input clock.

16. The apparatus of claim 15, wherein the TDC comprises:
a delay chain comprising delay cells, wherein the delay chain is to receive the frequency divided clock at an input of the delay chain;
a plurality of sequential circuitries, wherein each of the sequential circuitries is coupled to an output of an individual delay cell of the delay chain; and
a selection circuitry coupled to the plurality of sequential circuitries, wherein the selection circuitry includes a multiple of multiplexers, wherein each multiplexer is coupled to an individual sequential circuitry of the plurality of sequential circuitries.

17. The apparatus of claim 16 wherein the TDC comprises a plurality of logic gates, wherein each logic gate has an input coupled to an output of each multiplexer, wherein each logic gate includes one of: an AND gate, NAND gate, or NOR gate.

18. A system comprising:
a memory;
a processor coupled to the memory, wherein the processor includes a power management logic coupled to a time-to-digital converter (TDC), wherein the TDC is coupled to a frequency divider and to a power supply node whose voltage level is to be monitored, wherein the TDC has a latency of one cycle of an input clock, and wherein the frequency divider is to receive the input clock and to generate a frequency divided clock; and
a wireless interface to allow the processor to communicate with another device.

19. The system of claim 18, wherein the TDC comprises:
a delay chain comprising delay cells, wherein the delay chain is to receive the frequency divided clock at an input of the delay chain;
a plurality of sequential circuitries, wherein each of the sequential circuitries is coupled to an output of an individual delay cell of the delay chain; and
a selection circuitry coupled to the plurality of sequential circuitries, wherein the selection circuitry includes a multiple of multiplexers, wherein each multiplexer is coupled to an individual sequential circuitry of the plurality of sequential circuitries.

20. The system of claim 18, wherein the TDC comprises a plurality of logic gates, wherein each logic gate has an input coupled to an output of each multiplexer, and wherein each logic gate includes one of: an AND gate, NAND gate, or NOR gate.

* * * * *